United States Patent [19]

Namose

[11] Patent Number: 4,980,311

[45] Date of Patent: Dec. 25, 1990

[54] METHOD OF FABRICATING A SEMICONDUCTOR DEVICE

[75] Inventor: Isamu Namose, Nagano, Japan

[73] Assignee: Seiko Epson Corporation, Tokyo, Japan

[21] Appl. No.: 275,491

[22] Filed: Nov. 23, 1988

Related U.S. Application Data

[62] Division of Ser. No. 46,331, May 5, 1987, abandoned.

[51] Int. Cl.$^5$ .......................................... H01L 21/302
[52] U.S. Cl. ........................................ 437/67; 437/72
[58] Field of Search ............................... 437/67, 72, 38

[56] References Cited

U.S. PATENT DOCUMENTS

| | | | |
|---|---|---|---|
| 4,222,792 | 9/1980 | Lever et al. | 357/49 X |
| 4,394,196 | 7/1983 | Iwai | 437/38 |
| 4,396,460 | 8/1983 | Tamaki et al. | 357/49 X |
| 4,435,446 | 3/1984 | Marston et al. | 427/93 |
| 4,472,459 | 9/1984 | Fisher | 427/93 |
| 4,477,310 | 10/1984 | Park et al. | 156/643 |
| 4,660,068 | 4/1987 | Sakuma et al. | 357/49 |
| 4,666,556 | 5/1987 | Fulton et al. | 357/49 X |
| 4,859,615 | 8/1989 | Tsukamoto et al. | 437/47 |
| 4,876,217 | 10/1989 | Zoebel | 437/67 |

FOREIGN PATENT DOCUMENTS

| | | |
|---|---|---|
| 0020994 | 1/1981 | European Pat. Off. |
| 0044082 | 1/1982 | European Pat. Off. |
| 56-103443 | 8/1981 | Japan ................ 437/67 |
| 56-103444 | 8/1981 | Japan ................ 437/67 |
| 57-91535 | 6/1982 | Japan ................ 437/72 |
| 58-143548 | 8/1983 | Japan ................ 437/67 |
| 60-38831 | 2/1985 | Japan ................ 437/67 |
| 61-137338 | 6/1986 | Japan ................ 437/72 |
| 61-154144 | 7/1986 | Japan ................ 437/72 |

OTHER PUBLICATIONS

"Recessed Oxide Isolation Process", IBM Technical Disclosure Bulletin, vol. 20, No. 1, Jun. 1977, pp. 144–145.
"Method for Making Three-Dimensional Microstructures...", J. M. Blum et al., IBM Technical Disclosure Bulletin, vol. 21, No. 9, Feb. 1979, pp. 3814–3817.

Primary Examiner—Olik Chaudhuri
Assistant Examiner—George R. Fourson
Attorney, Agent, or Firm—Blum Kaplan

[57] ABSTRACT

A semiconductor device and method of fabrication thereof includes both narrow and wide element isolation regions which have been fabricated employing a trench isolation technique. The technique allows for the production of wide element isolation regions in submicron semiconductor devices wherein the entire wide element isolation region is covered with an insulating material.

27 Claims, 5 Drawing Sheets

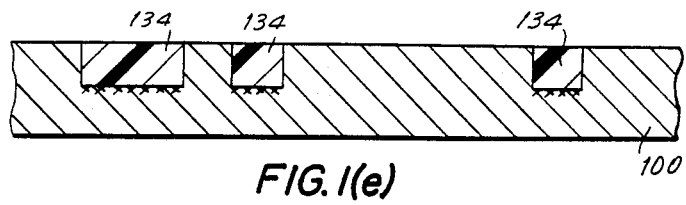
FIG. I(e)
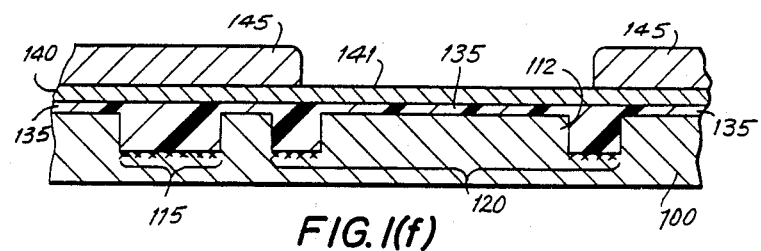
FIG. I(f)
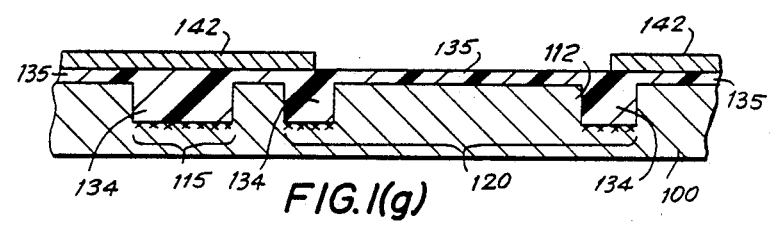
FIG. I(g)
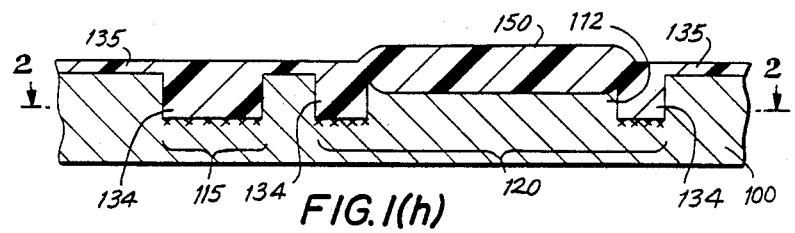
FIG. I(h)

METHOD OF FABRICATING A SEMICONDUCTOR DEVICE

This is a divisional of application Ser. No. 07/046,331, filed May 5, 1987, now abandoned.

BACKGROUND OF THE INVENTION

This invention relates generally to a semiconductor device and method of fabrication, and especially to semiconductor devices which have been fabricated using trench isolation technology to produce narrow and wide element isolation regions.

Typically, a semiconductor device employing a trench isolation method to produce isolation regions, forms trenches by reactive ion etching (RIE) of the substrate of the semiconductor. Depending, in part, upon the width of the trench etched, the trench is classified as either a narrow or wide element isolation region. Once the trench is formed, an insulating film, such as silicon oxide, is applied by, for example, chemical vapor deposition (CVD) to the surface of the substrate as well as within the trenches. The surface of the substrate is then etched such that the insulating film remains only within the trenches. For trenches of approximately four micrometers or more, which are considered wide element isolation regions, the insulating film is frequently of uneven thickness and can be so sparse as to leave large gaps within the trench where no insulating film exists whatsoever. Consequently, an undesirable capacitive effect between the insulating material and substrate, short circuiting or other undesirable effects of circuitry disposed within the trench can occur.

Japanese Laid Open Patent Application Nos. 55-78540, 56-94646 and 56-94647 have attempted to solve some of the above noted drawbacks but are unable to consistently fabricate wide element isolation regions in a submicron semiconductor device. Further, trench isolation technology is disclosed by Mikoshiba, et al. of NEC Corporation in an article from a 1984 IEDM Publication on pages 578–581.

Accordingly, it is desirable to provide an improved semiconductor including narrow and wide isolation regions which overcome the problems associated with the prior art devices.

SUMMARY OF THE INVENTION

In accordance with the invention, a semiconductor device and method of fabrication uses trench isolation technology to produce both narrow and wide element isolation regions within the substrate of the device. The method employs forming at least one trench which encloses a predetermined portion of the substrate over and around which the wide element isolation region is formed. The trenches are created by anisotropic etching of the semiconductor substrate and are filled with an insulating film. In one preferred embodiment, an anti-oxidation mask film is formed within the trenches and over the substrate surface except for that region which is enclosed by the trench followed by oxidizing the semiconductor substrate and then removing the anti-oxidation mask.

Accordingly, it is an object of this invention to provide an improved semiconductor device and method thereof which provides both narrow and wide element isolating regions employing trench isolation technology.

It is another object of the invention to provide such narrow and wide element isolation regions in submicron semiconductor devices.

It is yet another object of the invention to provide wide element isolation regions with insulating film throughout the region without gaps of insulating film within the region.

Still other objects and advantages of the invention will in part be obvious and will in part be apparent from the specification.

The invention accordingly comprises several steps and the relation of one or more of such steps with respect to each of the others, and the device embodying features of construction, combinations of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIGS. 1(a)–(h) are partial cross-sectional views of the processing steps to fabricate a semiconductor device in accordance with one embodiment of the invention;

DESCRIPTION OF THE PREFERRED EMBODIMENTS

Figure 1A:
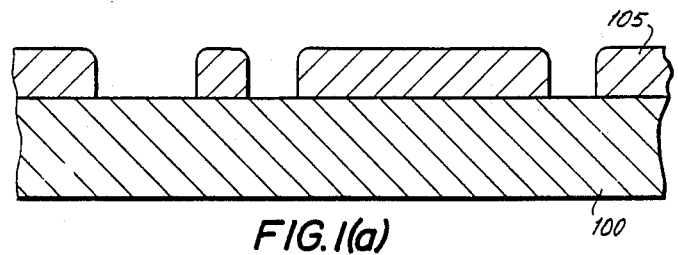
Figure 1B:
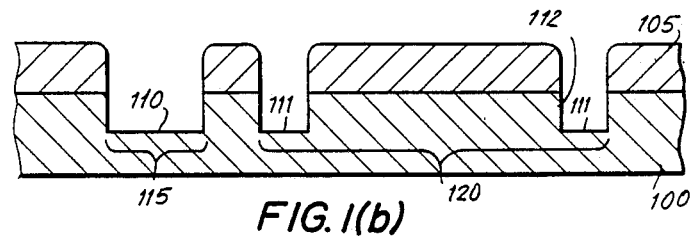

Referring now to FIGS. 1(a) and (b), a P-doped silicon substrate 100 is initially masked with an anti-anisotropic etching film 105 which when anisotropically etched by any suitable means such as, but not limited to, reactive ion etching using $CBrF_3$ gas, creates trenches 110 and 111 having a depth of approximately 7,000 angstroms in substrate 100. Suitable anti-anisotropic etching films include, but are not limited to, photo resist $SiO_2$ and $Si_3N_4$. Trenches 110 and 111 have been shown for illustrative purposes only as having substantially rectangular cross sections. Quite often, however, the trenches formed have concave cross sections and therefore should not be viewed as being limited to rectangular cross sections. Trench 111 encloses a predetermined portion 112 of substrate 100. As will be appreciated hereinafter, trench 110 will enclose a narrow element isolating region 115 and trench 111 will enclose a wide element isolating region 120.

Figure 1C:
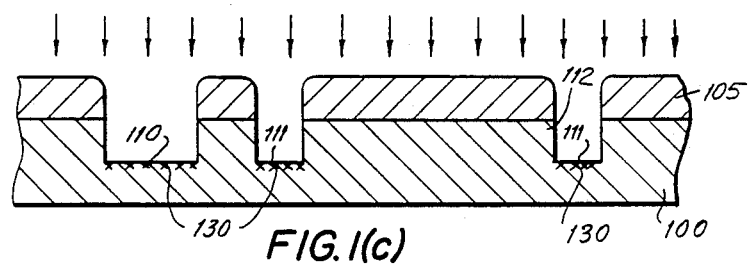
Figure 1D:
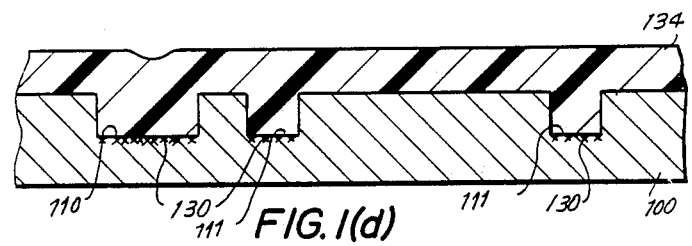

As shown in FIGS. 1(c) and (d), trenches 110 and 111 are implanted with boron ions having a concentration of about $3 \times 10^{13}/cm^2$ at about 30 keV to form stopper regions 130 at least the bottom of the trenches wherein the arrows shown indicate the direction of flight by the boron ions toward substrate 100 during implantation. Alternatively, when an N-doped silicon substrate is desired, phosphorous or arsenic ions can be implanted in at least the bottom of the trenches to form the stopper regions. A silicon oxide film 134 is next deposited by chemical vapor deposition (CVD) onto substrate 100 completely filling each trench and rising to a thickness of approximately one micrometer above the surface of substrate 100.

Silicon oxide film 134 is then removed by employing RIE using $CF_4+CHF_3$ gas resulting in silicon oxide film 134 remaining only in trenches 110 and 111 (refer to FIG. 1(*e*)). Thereafter, as shown in FIG. 1(*f*), substrate 100 is thermally oxidized under a dry oxygen atmosphere at approximately 1000° C. for about ten minutes to form a film of silicon oxide 135 having a thickness of about 800 angstroms on the surface of substrate 100. Alternatively, rather than removing all of silicon oxide 134 from the surface of substrate 100 as shown in FIG. 1(*e*), only a portion of silicon oxide film 134 need be etched from the surface of substrate 100 provided the silicon oxide film can be etched to obtain a thickness of about 800 angstroms. Of course, such etching must be carefully controlled and may be more difficult than thermally oxidizing substrate 100 to provide the desired thickness of 800 angstroms.

A film of silicon nitride 140 having a thickness of approximately 1500 angstroms is next formed on silicon oxide film 135 by vapor growth such as, but not limited to, CVD. A photoresist layer 145 is then used to mask silicon nitride film 140, except for a portion 141 of the latter overlaying portion 112 of substrate 100. Portion 141 of silicon nitride film 140 is then removed by plasma etching (i.e., isotropic etching) using $CF_4$ gas thereby exposing that portion of silicon oxide film 135 which overlays portion 112. Photoresist 145 is then removed by etching.

Figure 2:
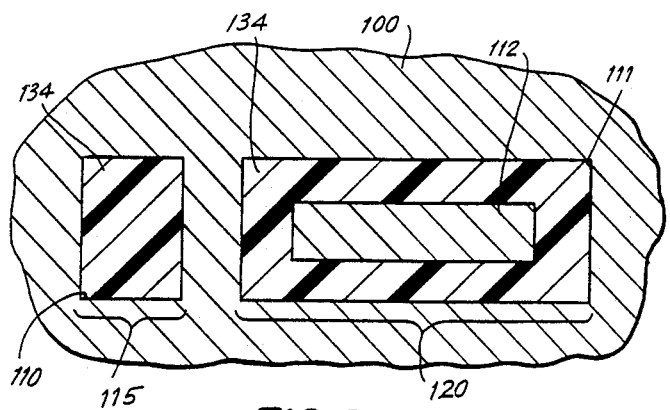
FIG. 2 is a plan of the cross-section view of the semiconductor device of FIG. 1(h) taken along lines 2—2 of FIG. 1(h).
Figure 3A:
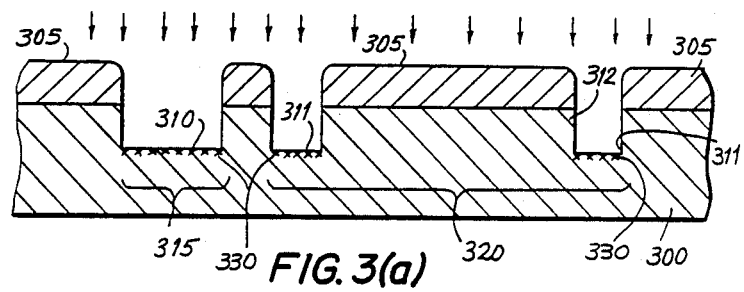
FIGS. 3(a)–(f) are partial cross-sectional views of the processing steps to fabricate a device in accordance with an alternative embodiment of the invention.
Figure 3B:
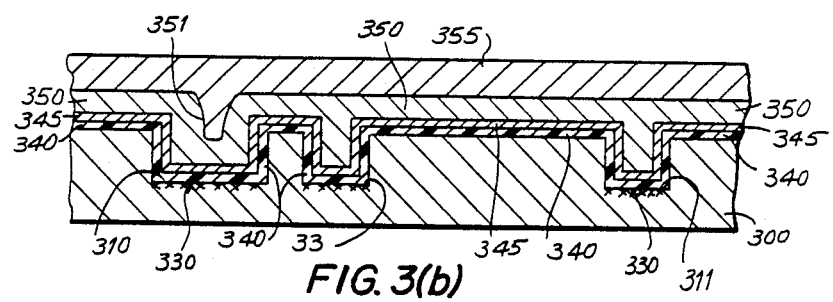
Figure 3C:
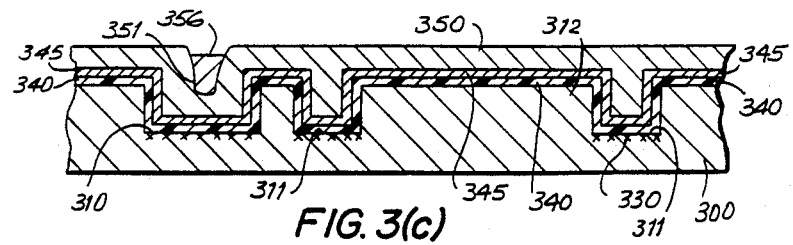
Figure 3D:
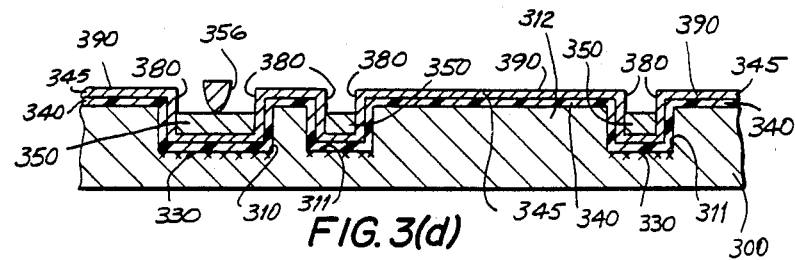
Figure 3E:
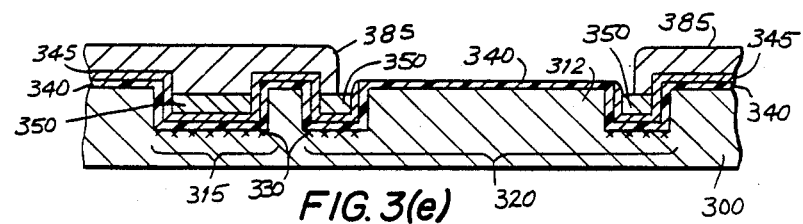
Figure 3F:
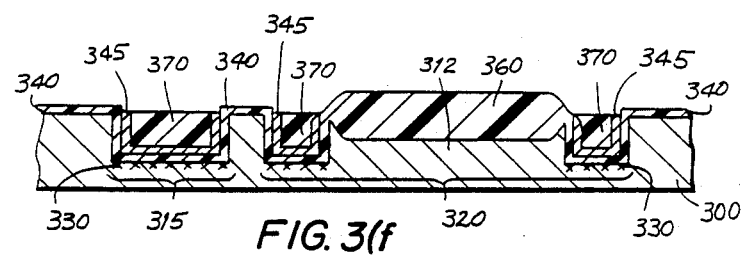

As shown in FIG. 1(*g*), the remaining portions 142 of silicon nitride 140 then serve as a mask for silicon oxide film 135. More particularly, substrate 100 is next oxidized under a wet oxygen atmosphere at about 950° C. at a pressure of about eight atmospheres for approximately one hour. Consequently, and as shown in FIG. 1(*h*), silicon oxide film 135 which overlays portion 112 becomes thickened oxidized film 150. Subsequently, portions 142 of silicon nitride film 140 are removed by etching resulting in the formation of narrow and wide element isolation regions 115 and 120, respectively. The plan in FIG. 2 illustrates substrate 100 and trenches 110 and 111 filled with silicon oxide film 134 following fabrication.

An alternative embodiment of the present invention is shown in FIGS. 3(*a*)-(*f*), in which a P-doped silicon substrate 300 has had trenches 310 and 311 formed through anisotropic etching of the substrate in accordance with the configuration of a mask 305. Trench 311 encloses a predetermined portion 312 of substrate 300. Stopper regions 330 are formed at least the bottom of the trenches by ion implantation of boron wherein the arrows shown indicate the direction of flight by the boron ions toward substrate 300 during implantation. The semiconductor device shown in FIG. 3(*a*) has been fabricated in the same manner as previously described for FIGS. 1(*a*)-(*c*) above. As will be appreciated hereinafter, trench 310 encloses an area which becomes a narrow element isolating region 315 and predetermined portion 312 along with trench 311 defines an area which becomes a wide element isolating region 320.

As shown in FIG. 3(*b*), a silicon oxide film 340 is formed on the surface of substrate 300 as well as within trenches 310 and 311 having a thickness of approximately 800 angstroms under a dry oxygen atmosphere. An anti-oxidation mask film of silicon nitride 345 having a thickness of approximately 1400 angstroms is formed on silicon oxide film 340 by vapor growth such as, but not limited to, CVD. A polycrystalline silicon film 350 having a thickness of approximately 3500 angstroms is then formed by vapor growth such as, but not limited to, CVD so as to cover silicon nitride film mask 345. As shown in FIG. 3(*b*), the width of trench 310 is somewhat greater than that of trench 110. Consequently, a portion of polycrystalline film 350 above trench 310 caves-in resulting in a pit 351 within polycrystalline film 350 above trench 310. A thermoplastic film such as photoresist 355 having a thickness of approximately 2 micrometers is then coated onto polycrystalline silicon film 350. The coating surface of photoresist 355 is smoothed by heating at approximately 200° C. for approximately 5 minutes.

Referring to FIG. 3(*c*), photoresist 355 is removed from the surface of polycrystalline silicon film 350 by plasma etching (i.e., isotropic etching) using oxygen. This etching is terminated once the surface of polycrystalline silicon 350 is reached. Consequently, only portion 356 of photoresist 355 within pit 351 remains. As shown in FIG. 3(*d*), polycrystalline silicon film 350 is then plasma etched (i.e., isotropically etched) using $CF_4$ gas with portion 356 of photoresist 355 serving as a mask for that portion of polycrystalline silicon film 350 within trench 310. Following this plasma etching, polycrystalline silicon film 350 remains only partially in each of the trenches wherein portions of the sidewalls 380 of each trench proximate to a surface 390 of substrate 300 are now exposed. Photoresist material 356, which has served as a mask for the polycrystalline silicon film 350 within trench 310, is then removed by any suitable means such as, but not limited to, etching.

As shown in FIG. 3(*e*), a thermoplastic film such as photoresist material 385 is used as a mask to cover all of silicon nitride film 345 except for that portion overlaying portion 312 which is then removed by plasma etching (i.e., isotropic etching) using $CF_4$ gas.

Finally, as shown in FIG. 3(*f*), photoresist 385 is removed. Substrate 300 is then exposed to a wet oxygen atmosphere at approximately 950° C. at about eight atmospheres of pressure for approximately two hours which results in the formation of a thickened oxide film 360 overlaying portion 312 and in changing polycrystalline silicon film 350 which is disposed within the trenches to silicon oxide film 370. The remaining silicon nitride film 345, which is outside the trenches is then removed resulting in the creation of narrow element isolating region 315 and wide element isolating region 320.

Figure 4A:
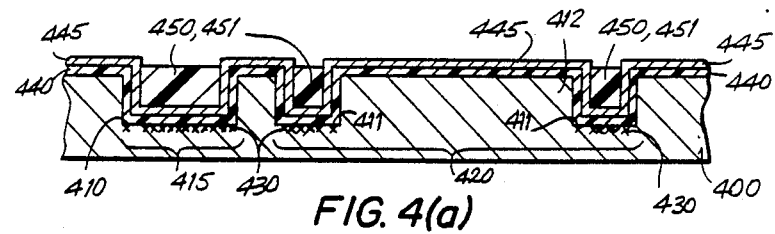
FIGS. 4(a)–(c) are partial cross-sectional views of processing steps to fabricate a device in accordance with another embodiment of the invention.
Figure 4B:
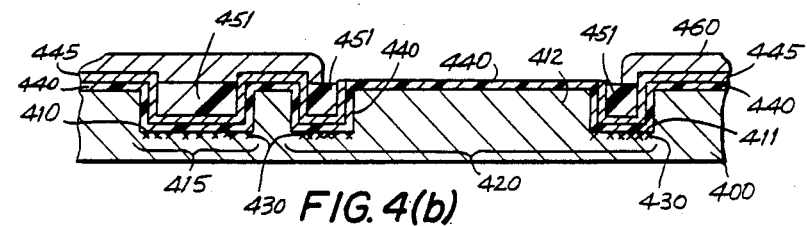
Figure 4C:
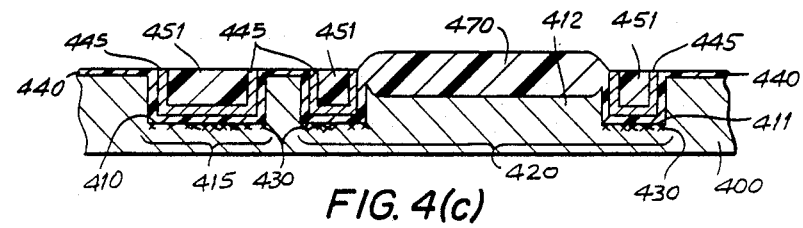

In yet another alternative embodiment of the present invention, FIG. 4(*a*) illustrates a semiconductor substrate 400 which has been ion implanted with boron along at least the bottom of trenches 410 and 411 to form stopper regions 430. Trench 411 encloses a predetermined portion 412 of substrate 400. Layers of silicon oxide film 440, silicon nitride film 445 and/or polycrystalline film 450 cover the surface of substrate 400 and the trenches. The trenches, stopper region and films are formed in the same manner as previously described with respect to FIGS. 3(*a*)-(*d*). Polycrystalline silicon film 450 is then thermally oxidized at approximately 950° C. at about eight atmospheres of pressure for about four hours resulting in the formation of silicon oxide film 451.

As shown in FIG. 4(*b*), a thermoplastic film such as photoresist material 460 is used to mask silicon nitride film 445 except for that area encompassing portion 412. Silicon nitride film 445 overlaying portion 412 is then removed by plasma etching (i.e., isotropic etching) using CF$_4$ gas.

Finally, as shown in 4(c), substrate 400 is oxidized under a wet oxide atmosphere at approximately 950° C. at about eight atmospheres of pressure for about one hour. An oxide film 470, overlaying portion 412 is thus formed. Silicon nitride film 445 is then removed from all portions of substrate 400 outside of the trenches thus creating narrow element isolating region 415 and wide element isolating region 420.

Other suitable and well known materials can be used in lieu of the materials described heretofore for fabricating the present invention. For example, photoresist 355 can be replaced with boron phosphorous silicate glass (BPSG film in which event the RIE method for removing the BPSG film will employ CF$_4$+H$_2$ gas. It is further to be understood that except for the narrow element and wide element isolating regions of the semiconductor substrate, MOS type electric field effect and Bipolar type transistors can be formed in the substrate using commonly employed, well known techniques.

As can now be appreciated, the narrow element isolating region of the present invention provides insulating material within each trench whereas the wide element isolating region provides a layer of insulating material spanning the enclosed trench.

As also can now be readily appreciated, the present invention provides a semiconductor device and method thereof employing a trench isolation technique having narrow and wide element isolating regions. The method can be used to produce narrow and wide element isolation regions in submicron semiconductor devices. In particular, each wide element isolating region contains insulating material throughout with no gaps of insulating material therein.

It will thus be seen that the objects set forth above, and those made apparent from the preceding description, are efficiently obtained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

What is claimed is:

1. A method for fabricating a semiconductor device comprising:
   forming trenches within a substrate of the device wherein at least one of the trenches encloses a predetermined portion of the substrate;
   disposing insulating film within the trenches;
   forming a first mask over the substrate except for that area encompassed by the predetermined portion;
   oxidizing the substrate to form an oxide film over the predetermined portion; and
   creating a plurality of narrow and wide element isolating regions in and on the substrate.

2. The method of claim 1, wherein the trenches are formed in accordance with the configuration of an additional mask comprising an anti-anisotropic etching film.

3. The method of claim 2, wherein the trenches are formed by anisotropic etching of the additional mask and substrate.

4. The method of claim 3, wherein the trenches are formed by reactive ion etching using CBrF$_3$.

5. The method of claim 4, wherein the additional mask comprises a material selected from the group consisting of photoresist, SiO$_2$ and Si$_3$N$_4$.

6. The method of claim 1, wherein the insulating film is disposed within the trenches and on the surface of the substrate by chemical vapor deposition of silicon oxide.

7. The method of claim 1, wherein the first mask comprises an anti-oxidation film.

8. The method of claim 7, wherein the first mask is formed by vapor growth of a silicon nitride film over the insulting film, placing a thermal plastic material over the silicon nitride film except over that area encompassing the predetermined portion, removing that portion of the silicon nitride film which overlays the predetermined portion and finally removing the thermal plastic material.

9. The method of claim 7, wherein the anti-oxidation film has an end portion formed on the insulating film within the trenches.

10. The method of claim 1, wherein the substrate is oxidized under a wet oxygen atmosphere at approximately eight atmospheres of pressure for approximately one hour.

11. The method of claim 1, wherein the isolating regions are created by removing the first mask from all portions of the substrate.

12. The method of claim 1, further comprising providing stopper regions at least at the bottom of the trenches.

13. The method of claim 12, wherein the stopper regions are created by ion implantation.

14. The method of claim 13, wherein the ions implanted are selected from the group consisting of boron, phosphorous and arsenic.

15. The method of claim 1, further comprising disposing polycrystalline silicon film within the trenches.

16. The method of claim 14, wherein the polycrystalline silicon film is disposed below the surface of the substrate.

17. The method of claim 16, wherein the insulating film is further disposed on the surface of the substrate; and wherein the first mask is formed first by vapor growth of silicon nitride film over the insulating film followed by disposition of the polycrystalline film within the trenches whereby the silicon nitride film is sandwiched between the insulating film and the polycrystalline silicon film followed by formation of an additional mask over the silicon nitride film except for that area encompassing the predetermined portion followed by removal of the silicon nitride film over that area encompassing the predetermined portion and finally by removal of the additional mask.

18. The method of claim 17, wherein the additional mask is selected from the group of materials consisting of photoresist film and boron phosphorous silicate glass and is removed by plasma etching using oxygen; and the silicon nitride film is removed from the area encompassing the predetermined portion by plasma etching using CF$^4$ gas.

19. The method of claim 16, further comprising oxidizing the polycrystalline silicon film to form silicon oxide film.

20. The method of claim 19, wherein the isolating regions are created by removing all portions of the first mask which extend outside the trenches.

21. The method of claim 19, further comprising thermally oxidizing the polycrystalline silicon at a temperature of about 950° C., at about eight atmospheres of pressure for about four hours.

22. The method of claim 15, wherein the polycrystalline silicon film is disposed only within the trenches by first disposing a film of polycrystalline silicon over the entire silicon nitride film.

23. The method of claim 22, wherein the polycrystalline silicon film is removed from the surface substrate and partially from within the trenches by plasma etching using $CF_4$ gas.

24. A method of fabricating a semiconductor device comprising:
   forming a first mask over a substrate of the device;
   etching the substrate to form trenches in accordance with the configuration of the first mask wherein one of said trenches encloses a predetermined portion of the substrate;
   removing the first mask;
   depositing an insulating film of silicon oxide within the trenches and on the surface of the substrate;
   depositing an anti-oxidation mask of silicon nitride film over the insulating film;
   forming a second mask over the silicon nitride film except for those portions of the silicon nitride film overlaying the predetermined portion;
   removing that portion of the silicon nitride film covering the predetermined portion to expose the insulating film of silicon oxide;
   removing the second mask;
   oxidizing the substrate; and
   removing all remaining portions of the silicon nitride film outside the trenches thereby creating a plurality of narrow and wide element isolating regions in and on the substrate.

25. A method of fabricating a semiconductor device comprising:
   etching the substrate to form trenches wherein one of said trenches encloses a predetermined portion of the substrate;
   depositing an insulating film of silicon oxide within the trenches and on the surface of the substrate;
   depositing an anti-oxidation mask of silicon nitride film over the insulating film;
   depositing a film of polycrystalline silicon over the anti-oxidation mask;
   coating the polycrystalline silicon film with a photoresist material;
   etching all of the photoresist material except that portion overlaying at least one of the trenches;
   removing all of the polycrystalline silicon film overlaying the surface of the substrate;
   removing a portion of the polycrystalline film within each of the trenches; and
   removing the remaining photoresist material.

26. The method of claim 25, further comprising disposing additional photoresist material covering the silicon nitride film except for those areas overlaying the predetermined portion; removing the silicon nitride film overlaying the predetermined portion to expose the insulating film of silicon oxide; removing the additional photoresist material; oxidizing the substrate; and removing the remaining silicon nitride film outside the trenches whereby a plurality of narrow and wide element isolating regions in and on the substrate are created.

27. The method of claim 25, further comprising oxidizing the polycrystalline film disposed within the trenches to form silicon oxide; disposing additional photoresist material over the silicon nitride film except for those areas above the predetermined portion; removing the silicon nitride film overlaying the predetermined portion to expose the insulating film of silicon oxide; removing the additional photoresist material; oxidizing the substrate; and removing the remaining silicon nitride film outside the trenches whereby a plurality of narrow and wide element isolating regions in and on the substrate are created.

* * * * *